(12) United States Patent
Tsuboi et al.

(10) Patent No.: US 10,424,613 B2
(45) Date of Patent: Sep. 24, 2019

(54) SOLID-STATE IMAGING DEVICE, MANUFACTURING METHOD OF SOLID-STATE IMAGING DEVICE, AND IMAGING SYSTEM

(71) Applicant: CANON KABUSHIKI KAISHA, Tokyo (JP)

(72) Inventors: Hiromasa Tsuboi, Tama (JP); Fumihiro Inui, Yokohama (JP); Masahiro Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 16 days.

(21) Appl. No.: 15/631,391

(22) Filed: Jun. 23, 2017

(65) Prior Publication Data

US 2018/0026073 A1 Jan. 25, 2018

(30) Foreign Application Priority Data

Jul. 21, 2016 (JP) ................................ 2016-143096

(51) Int. Cl.
*H01L 27/148* (2006.01)
*H01L 27/146* (2006.01)

(52) U.S. Cl.
CPC .... *H01L 27/14806* (2013.01); *H01L 27/1463* (2013.01); *H01L 27/14683* (2013.01)

(58) Field of Classification Search
CPC .......... H01L 27/14806; H01L 27/1463; H01L 27/14683
USPC ....................................................... 257/225
See application file for complete search history.

(56) References Cited

U.S. PATENT DOCUMENTS

| | | | |
|---|---|---|---|
| 7,227,208 B2 | 6/2007 | Ogura et al. .................. | 257/292 |
| 7,462,810 B2 | 12/2008 | Kobayashi et al. ........ | 250/208.1 |
| 7,561,199 B2 | 7/2009 | Noda et al. .................. | 348/308 |
| 7,719,587 B2 | 5/2010 | Ogura et al. .................. | 348/302 |
| 7,928,477 B2 | 4/2011 | Kobayashi et al. .......... | 257/225 |
| 7,935,995 B2 | 5/2011 | Watanabe et al. ............ | 257/292 |
| 8,045,034 B2 | 10/2011 | Shibata et al. ............... | 348/308 |
| 8,063,351 B2 | 11/2011 | Kobayashi et al. ........ | 250/208.1 |

(Continued)

FOREIGN PATENT DOCUMENTS

| | | |
|---|---|---|
| JP | 2015-201834 | 11/2005 |
| JP | 2011-040543 | 2/2011 |
| JP | 2011-091367 | 5/2011 |

OTHER PUBLICATIONS

U.S. Appl. No. 15/467,919, filed Mar. 23, 2017.

(Continued)

*Primary Examiner* — Tong-Ho Kim
(74) *Attorney, Agent, or Firm* — Venable LLP

(57) ABSTRACT

A solid-state imaging device has: a counter dope region of a first conductivity type which is formed so as to surround a drain region of a transfer transistor of the solid-state imaging device and in which impurity concentration of the first conductivity type is lower than that of the drain region; and an isolating region of a second conductivity type which is formed in a deep region below channel regions of a plurality of transistors and in which impurity concentration of the second conductivity type is higher than that of a well region, wherein a depth position of a lower surface of the counter dope region is deeper than a depth position of a lower surface of a buried channel region.

12 Claims, 11 Drawing Sheets

(56) References Cited

U.S. PATENT DOCUMENTS

| | | | |
|---|---|---|---|
| 8,115,848 B2 | 2/2012 | Onuki et al. | 348/308 |
| 8,174,604 B2 | 5/2012 | Shibata et al. | 348/308 |
| 8,222,682 B2 | 7/2012 | Watanabe et al. | 257/292 |
| 8,259,205 B2 | 9/2012 | Noda et al. | 348/308 |
| 8,259,206 B1 | 9/2012 | Shibata et al. | 348/308 |
| 8,289,432 B2 | 10/2012 | Shibata et al. | 348/308 |
| 8,357,956 B2 | 1/2013 | Kobayashi et al. | 257/225 |
| 8,427,564 B2 | 4/2013 | Yamashita et al. | 348/294 |
| 8,456,559 B2 | 6/2013 | Yamashita et al. | 348/308 |
| 8,466,401 B2 | 6/2013 | Arishima et al. | 250/208.1 |
| 8,552,353 B2 | 10/2013 | Kobayashi et al. | 250/208.1 |
| 8,723,232 B2 | 5/2014 | Kobayashi et al. | 257/225 |
| 8,736,734 B2 | 5/2014 | Onuki et al. | 348/308 |
| 8,884,391 B2 | 11/2014 | Fudaba et al. | 257/432 |
| 8,952,433 B2 | 2/2015 | Inui | 257/292 |
| 9,147,708 B2 | 9/2015 | Okita et al. | H01L 27/1461 |
| 9,153,610 B2 | 10/2015 | Kobayashi et al. | H04N 5/378 |
| 9,276,027 B2 | 3/2016 | Okita et al. | H01L 27/14812 |
| 9,344,653 B2 | 5/2016 | Shimotsusa et al. | H01L 27/14623 |
| 9,419,038 B2 | 8/2016 | Kobayashi et al. | H01L 27/14612 |
| 9,445,026 B2 | 9/2016 | Kobayashi et al. | H01L 27/14636 |
| 9,538,112 B2 | 1/2017 | Wada et al. | H04N 5/378 |
| 9,548,328 B2 | 1/2017 | Hasegawa et al. | H01L 27/1464 |
| 9,716,849 B2 | 7/2017 | Kobayashi et al. | H01L 27/14612 |
| 2006/0226438 A1* | 10/2006 | Katsuno | H01L 27/14627 257/113 |
| 2011/0031576 A1 | 2/2011 | Iwasa et al. | 257/440 |
| 2013/0206965 A1 | 8/2013 | Yamashita et al. | 250/208.1 |
| 2014/0061436 A1 | 3/2014 | Kobayashi | 250/208.1 |
| 2015/0062367 A1 | 3/2015 | Inui | 348/222.1 |
| 2015/0264283 A1 | 9/2015 | Kobayashi et al. | H01L 27/1463 |
| 2015/0281614 A1 | 10/2015 | Yoshida et al. | H04N 5/3745 |
| 2016/0071896 A1 | 3/2016 | Kawabata et al. | H01L 27/14621 |
| 2016/0071902 A1 | 3/2016 | Okita et al. | H01L 27/14625 |
| 2016/0219238 A1* | 7/2016 | Tsuboi | H04N 5/37457 |
| 2016/0227139 A1 | 8/2016 | Shimotsusa et al. | H01L 27/14627 |
| 2016/0322406 A1 | 11/2016 | Kobayashi et al. | H01L 27/14612 |
| 2016/0334550 A1 | 11/2016 | Kawabata | G02B 3/0056 |
| 2016/0334621 A1 | 11/2016 | Kawabata et al. | H01L 27/14627 |
| 2016/0360126 A1* | 12/2016 | Soda | H01L 27/1463 |
| 2017/0077164 A1 | 3/2017 | Kawabata | H01L 27/14645 |
| 2017/0078557 A1 | 3/2017 | Kawabata et al. | H04N 5/37457 |
| 2017/0078594 A1 | 3/2017 | Kawabata et al. | H04N 5/2353 |
| 2017/0078604 A1 | 3/2017 | Kobayashi et al. | H04N 5/3575 |
| 2017/0104942 A1 | 4/2017 | Hirota et al. | H04N 5/35563 |
| 2017/0301719 A1* | 10/2017 | Iwata | H01L 27/14645 |

OTHER PUBLICATIONS

U.S. Appl. No. 15/589,830, filed May 8, 2017.
U.S. Appl. No. 15/631,411, filed Jun. 23, 2017.
U.S. Appl. No. 15/584,718, filed May 2, 2017.
U.S. Appl. No. 15/594,259, filed May 12, 2017.
U.S. Appl. No. 15/601,620, filed May 22, 2017.

* cited by examiner

SOLID-STATE IMAGING DEVICE, MANUFACTURING METHOD OF SOLID-STATE IMAGING DEVICE, AND IMAGING SYSTEM

BACKGROUND OF THE INVENTION

Field of the Invention

The present invention relates to a solid-state imaging device and, more particularly, to an improvement of characteristics of a transfer transistor for transferring signal charges in a pixel.

Description of the Related Art

In a solid-state imaging device which is used in a digital still camera or a digital camcorder, a microfabrication of a pixel is being progressed. According to Japanese Patent Application Laid-Open No. 2011-91367, in order to suppress a mixture (crosstalk) of electric charges between pixels which increases in association with the microfabrication, an isolating region serving as a barrier at the time when signal charges leak from a photoelectric conversion element is provided in a deep region below a semiconductor region around the pixel.

However, the related arts have the following problems.

When an isolating region is formed, it is known that what is called a resist approximation effect in which impurities which are injected collide with a side wall and the like of a resist, an energy is lost, and impurity concentration rises in a semiconductor region over the isolating region occurs (for example, refer to Japanese Patent Application Laid-Open No. 2011-40543). Particularly, when a distance between the adjacent pixels decreases in association with the microfabrication of the solid-state imaging device, an area of the semiconductor region in which a transistor and the like are arranged also decreases, so that an influence by the resist approximation effect cannot be ignored.

According to Japanese Patent Application Laid-Open No. 2011-91367, the isolating region is provided in a deep region below a semiconductor region in which a transfer transistor and the like are arranged. Therefore, there is such a problem that a threshold value of the transfer transistor varies due to a potential barrier caused by the impurities which extend and are distributed over the isolating region by the resist approximation effect and transfer characteristics of the transfer transistor deteriorate.

SUMMARY OF THE INVENTION

According to an aspect of the present invention, there is provided a solid-state imaging device having a pixel in which a photoelectric conversion unit configured to accumulate electric charges generated by photoelectrically converting incident light, a transfer transistor of an MOS type configured to transfer the electric charges from the photoelectric conversion unit to a floating diffusion unit, and an outputting unit configured to output a signal corresponding to an amount of electric charges transferred to the floating diffusion unit are arranged in a well region of a second conductivity type, wherein: a first semiconductor region of the well region includes a first isolating region of the second conductivity type which is formed in a deep region below a drain region of a first conductivity type of the transfer transistor and in which impurity concentration of the second conductivity type is higher than that of the well region and a counter dope region of the first conductivity type which is formed in a region from an upper surface of the first semiconductor region to a depth position where impurity concentration of the first conductivity type of the photoelectric conversion unit becomes a peak so as to surround the drain region and in which the impurity concentration of the first conductivity type is lower than that of the drain region; a second semiconductor region extending in a direction which perpendicularly crosses the first semiconductor region when seen as a plan view includes a buried channel region of the first conductivity type formed in channel regions of a plurality of transistors which the outputting unit has and a second isolating region of the second conductivity type which is formed in a deep region below the buried channel region and in which impurity concentration of the second conductivity type is higher than that of the well region; and a depth position of a lower surface of the counter dope region is deeper than a depth position of a lower surface of the buried channel region.

According to another aspect of the present invention, there is provided a manufacturing method of a solid-state imaging device having a pixel in which a photoelectric conversion unit configured to accumulate electric charges generated by photoelectrically converting incident light, a transfer transistor of the MOS type configured to transfer the electric charges from the photoelectric conversion unit to a floating diffusion unit, and an outputting unit configured to output a signal corresponding to an amount of electric charges transferred to the floating diffusion unit are arranged in a well region of a second conductivity type, comprising the steps of: forming a first isolating region of the second conductivity type in which impurity concentration of the second conductivity type is higher than that of a well region into a deep region of a first semiconductor region of the well region; injecting impurities of a first conductivity type into the first semiconductor region from an upper surface of the first semiconductor region to a depth position where impurity concentration of the first conductivity type of the photoelectric conversion unit becomes a peak, thereby forming a counter dope region of the first conductivity type; forming a drain region of the first conductivity type in which impurity concentration of the first conductivity type is higher than that of the counter dope region into the counter dope region; forming a second isolating region of the second conductivity type in which impurity concentration of the second conductivity type is higher than that of the well region into a deep region of a second semiconductor region extending in a direction which perpendicularly crosses the first semiconductor region when seen as a plan view; and forming a plurality of transistors over the second isolating region and forming a buried channel region of the first conductivity type into channel regions of the plurality of transistors, wherein the step of forming the counter dope region and the step of forming the buried channel region are executed by using different photomasks.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
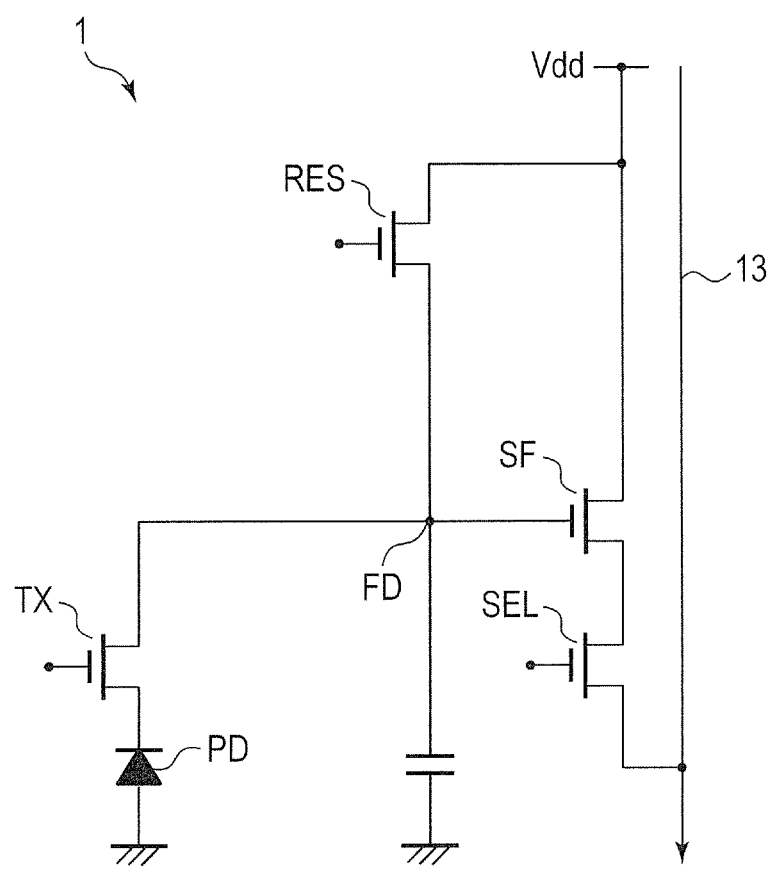
FIG. 1 is a schematic diagram illustrating an equivalent circuit of a pixel in a solid-state imaging device according to the first embodiment.

A solid-state imaging device according to the first embodiment will be described with reference to FIGS. 1 to 5. FIG. 1 is a schematic diagram illustrating an equivalent circuit of a pixel 1 in the solid-state imaging device according to the first embodiment.

The pixel 1 of the embodiment illustrated in FIG. has a photoelectric conversion unit PD, a transfer transistor TX, an amplifier transistor SF, a reset transistor RES, and a select transistor SEL. The transfer transistor TX, reset transistor RES, and select transistor SEL are controlled by control signals which are output from a vertical scanning circuit (not shown). It is sufficient that the pixel 1 of the embodiment has at least the photoelectric conversion unit PD and transfer transistor TX and there is also a case where the other transistors are omitted. In the following description, there is a case where the amplifier transistor SF, select transistor SEL, and reset transistor RES are collectively called an outputting unit.

The photoelectric conversion unit PD photoelectrically converts the incident light and accumulates electrons among the electrons and holes generated by the photoelectric conversion. The outputting unit of the pixel 1 outputs a pixel signal corresponding to an amount of electric charges of the electrons accumulated in the photoelectric conversion unit PD. The photoelectric conversion unit PD may be constructed so as to accumulate the holes among the electrons and holes generated by the photoelectric conversion and the outputting unit may be constructed so as to output a pixel signal corresponding to an amount of electric charges of the accumulated holes.

The transfer transistor TX transfers the signal charges accumulated in the photoelectric conversion unit PD to a floating diffusion unit FD (Floating Diffusion). The floating diffusion unit FD denotes a floating capacitor which is formed at a connecting point of three terminals of a drain of the transfer transistor TX, a gate of the amplifier transistor SF, and a source of the reset transistor RES. The floating diffusion unit FD holds the signal charges transferred from the photoelectric conversion unit PD.

The amplifier transistor SF outputs a signal corresponding to an amount of signal charges transferred to the floating diffusion unit FD. The select transistor SEL outputs the signal output from the amplifier transistor SF to a column signal line 13. The reset transistor RES resets the signal charges transferred to the floating diffusion unit FD. A current source (not shown) is connected to one end of the column signal line 13. The amplifier transistor SF, the current source (not shown), and the column signal line 13 construct a source follower circuit of the pixel 1. A reference potential such as a grounded potential or the like is supplied to those transistors and the photoelectric conversion unit PD. An electric potential Vdd is supplied to a drain terminal of the amplifier transistor SF and a drain terminal of the reset transistor RES.

Figure 2:
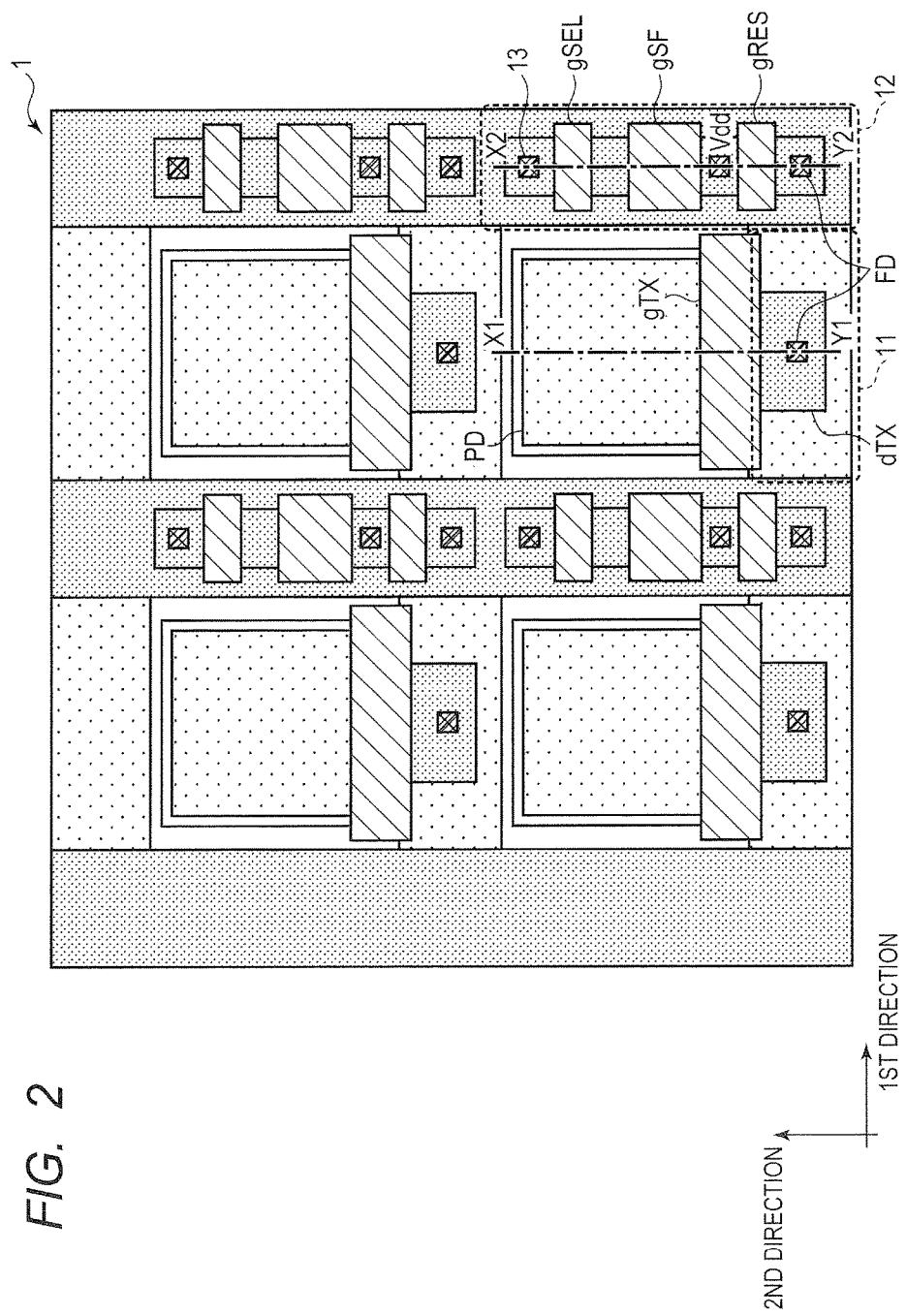
FIG. 2 is a schematic diagram illustrating a layout of a part of the pixel in the solid-state imaging device according to the first embodiment.

FIG. 2 is a schematic diagram illustrating a layout (plan view) of a part of the pixel 1 in the solid-state imaging device according to the first embodiment. Although four pixels 1 constructed by (2 rows×2 columns) are illustrated in FIG. 2, the actual solid-state imaging device has a larger number of rows and columns. Although the following description will be made on the assumption that one pixel 1 has one photoelectric conversion unit PD, the invention is not limited to such a construction. As will be described in the following second and third embodiments, one pixel 1 may have a plurality of photoelectric conversion units PD.

A first semiconductor region 11 extending in the first direction along one side of the photoelectric conversion unit PD and a second semiconductor region 12 extending in the second direction which perpendicularly crosses the first direction are provided around the photoelectric conversion unit PD of the pixel 1. A drain region dTX of the transfer transistor TX is formed in the first semiconductor region 11. A gate electrode gTX of the transfer transistor TX is formed so as to cover a region between the photoelectric conversion unit PD and the drain region dTX of the transfer transistor TX. A gate electrode gSF of the amplifier transistor SF, a gate electrode gRES of the reset transistor RES, and a gate electrode gSEL of the select transistor SEL are formed in the second semiconductor region 12.

As described in FIG. 1, the floating diffusion unit FD is connected to the drain region dTX of the transfer transistor TX, the gate electrode gSF of the amplifier transistor SF, and the source terminal of the reset transistor RES, respectively. The column signal line 13 is connected to a source terminal of the select transistor SEL. The electric potential Vdd is connected to the drain terminal of the amplifier transistor SF and the drain terminal of the reset transistor RES.

Figure 3:
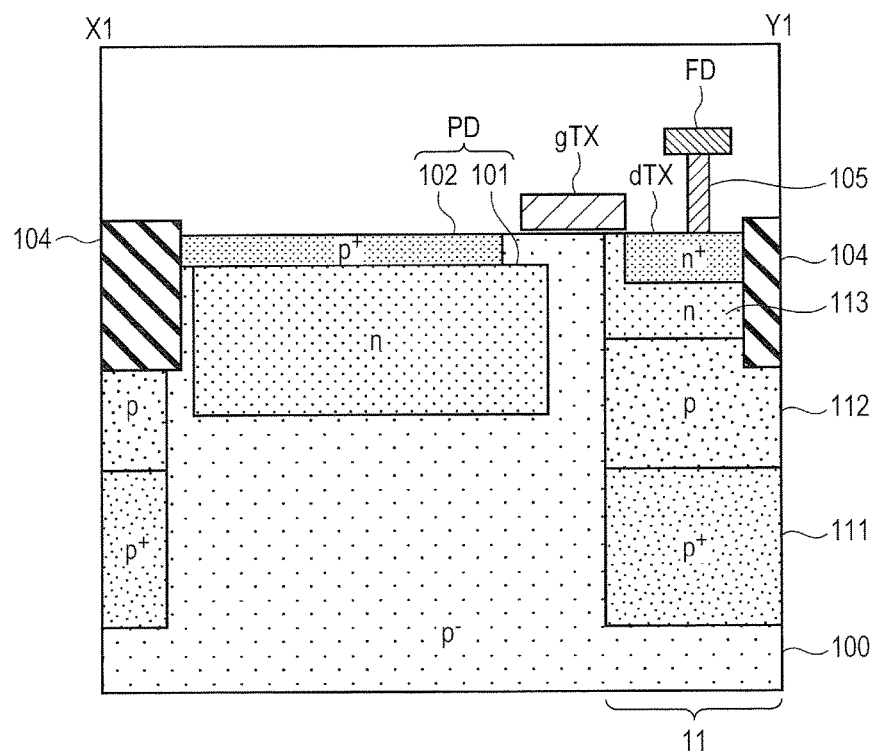
FIG. 3 is a first schematic diagram illustrating a cross section of a transfer transistor in the solid-state imaging device according to the first embodiment.

FIG. 3 is a schematic diagram illustrating a cross section of the pixel 1 in the solid-state imaging device according to the first embodiment and illustrates the cross section taken along the X1-Y1 line in the plan view illustrated in FIG. 2. A pixel isolating portion 104 to prevent an electrical interference between the pixels is formed in a boundary portion between the pixel 1 and the pixel adjacent thereto. The pixel isolating portion 104 is formed by, for example, an STI (Shallow Trench Isolation) isolation, an LOCOS (Local Oxidation of Silicon) isolation, a p-type diffusion layer isolation, or the like.

The photoelectric conversion unit PD having an n-type region 101 and a p-type region 102 is formed in a p-type well region 100 of the pixel 1. The drain region dTX of the transfer transistor TX of an MOS type is formed in an upper surface of the first semiconductor region 11 of the well region 100. As mentioned above, the drain region dTX of the transfer transistor TX is electrically connected to the floating diffusion unit FD through a contact 105. The gate electrode gTX of the transfer transistor TX is formed over a channel region between the n-type region 101 of the photoelectric conversion unit PD and the drain region dTX through an insulating film (not shown). In this instance, the channel region is a region where a channel can be formed when the transistor is operating.

A color filter, microlenses, and the like (not shown) are formed over the p-type region 102 of the photoelectric conversion unit PD. The light which enters from the upper portion in FIG. 3 is photoelectrically converted into the photoelectric conversion unit PD and generated signal charges are accumulated in the n-type region 101 of the photoelectric conversion unit PD. The signal charges accumulated in the photoelectric conversion unit PD are transferred to the floating diffusion unit FD when the gate electrode gTX of the transfer transistor TX is turned on.

A p-type first isolating region 111 serving as a barrier of the signal charges which leak to the photoelectric conversion unit PD of the adjacent pixel 1 is formed in a deep region of the first semiconductor region 11. For example, the first isolating region 111 is formed by injecting boron into the well region 100 by an ion injection. Concentration of p-type impurities of the first isolating region 111 is higher than concentration of p-type impurities of the well region 100.

When the first isolating region 111 is formed by injecting the ions into the deep region of the first semiconductor region 11, there is a case where an incident angle of the ions which are injected varies due to characteristics of an ion beam. A part of the ions which are obliquely injected when a fine pattern is formed pass through an opening edge of a photoresist of a high aspect ratio or are reflected by a side wall of the photoresist, so that they enter a semiconductor substrate in a state where an energy has partially been lost from a predetermined injection energy. Such ions of the energy which has partially been lost as mentioned above do not reach a desired depth but are distributed over the first isolating region 111. When the first isolating region 111 is formed, a third isolating region 112 is formed over the first isolating region 111 as a side effect by what is called a resist approximation effect as mentioned above.

Figure 4:
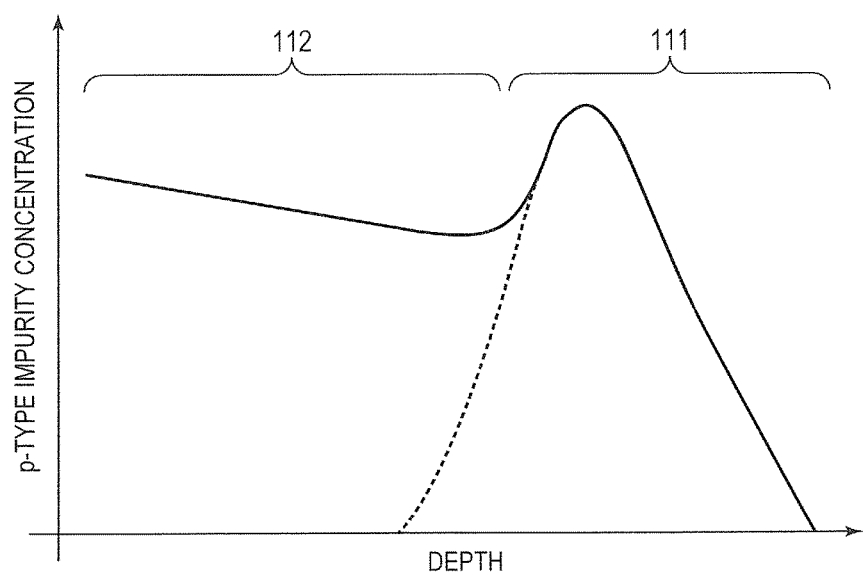
FIG. 4 is a diagram illustrating p-type impurity concentration distribution in a depth direction in isolating regions of the solid-state imaging device according to the first embodiment.

FIG. 4 is a diagram illustrating concentration distribution of p-type impurities in the depth direction in the isolating regions of the solid-state imaging device according to the first embodiment. The p-type impurity concentration in the first isolating region 111 has distribution near Gaussian having a peak in a projection range neighborhood of the injection ions. On the other hand, impurity concentration of the third isolating region 112 has such distribution that as the depth becomes shallower, the p-type impurity concentration increases by the resist approximation effect.

In association with the microfabrication of the solid-state imaging device in recent years, a distance between the adjacent pixels decreases, a width of the first isolating region 111 where the drain region dTX of the transfer transistor TX is arranged also becomes narrow, and an influence by the resist approximation effect cannot be ignored. Particularly, when the third isolating region 112 extends into the n-type region 101 of the photoelectric conversion unit PD or a region just under the gate electrode gTX, a potential barrier by the p-type impurities occurs between the n-type region 101 and the gate electrode gTX. Thus, for example, a threshold value of the transfer transistor TX increases and it becomes difficult to transfer the signal charges accumulated in the photoelectric conversion unit PD to the floating diffusion unit FD.

Therefore, in the transfer transistor TX of the embodiment, as illustrated in FIG. 3, an n-type counter dope region 113 formed in such a manner that the p-type impurity concentration by the resist approximation effect is set off is provided between the drain region dTX and the third isolating region 112. The counter dope region 113 is formed by, for example, ion-injecting arsenic into the region where the p-type impurity concentration has increased by the resist approximation effect. n-type impurity concentration of the counter dope region 113 is lower than n-type impurity concentration of the drain region dTX. Since such a situation that the potential barrier occurs between the n-type region 101 of the photoelectric conversion unit PD and the gate electrode gTX is suppressed by such a construction, a deterioration of the transfer characteristics of the transfer transistor TX in association with the microfabrication of the pixel 1 can be suppressed.

In the embodiment, as illustrated in FIG. 3, a depth position of the lower surface of the counter dope region 113 is set to a position similar to a depth position where the n-type impurity concentration of the photoelectric conversion unit PD becomes a peak. Thus, such a situation that the third isolating region 112 extends to the n-type region 101 of the photoelectric conversion unit PD can be suppressed. The counter dope region 113 overlaps partially with the gate electrode gTX when seen as a plan view and is formed so as to surround the drain region dTX. Thus, such a situation that the third isolating region 112 extends to the channel region just under the gate electrode gTX can be suppressed.

Consequently, while suppressing crosstalk between the pixels by the first isolating region 111, the deterioration of the transfer characteristics of the transfer transistor TX can be suppressed by the counter dope region 113. That is, the suppression of the crosstalk between the pixels and the suppression of the deterioration of the transfer characteristics of the transfer transistor TX can be made compatible with a good balance.

The counter dope region 113 is not always limited to such a construction as illustrated in FIG. 3 but it is sufficient that the counter dope region 113 is formed from the upper surface of the first semiconductor region 11 to the depth position where the p-type impurity concentration of the photoelectric conversion unit PD becomes a peak so as to surround the drain region dTX. According to such a construction, since such a situation that the third isolating region 112 extends to the photoelectric conversion unit PD or the channel region just under the gate electrode gTX can be suppressed, such a situation that the potential barrier occurs between the n-type region 101 of the photoelectric conversion unit PD and the gate electrode gTX can be suppressed.

Figure 5:
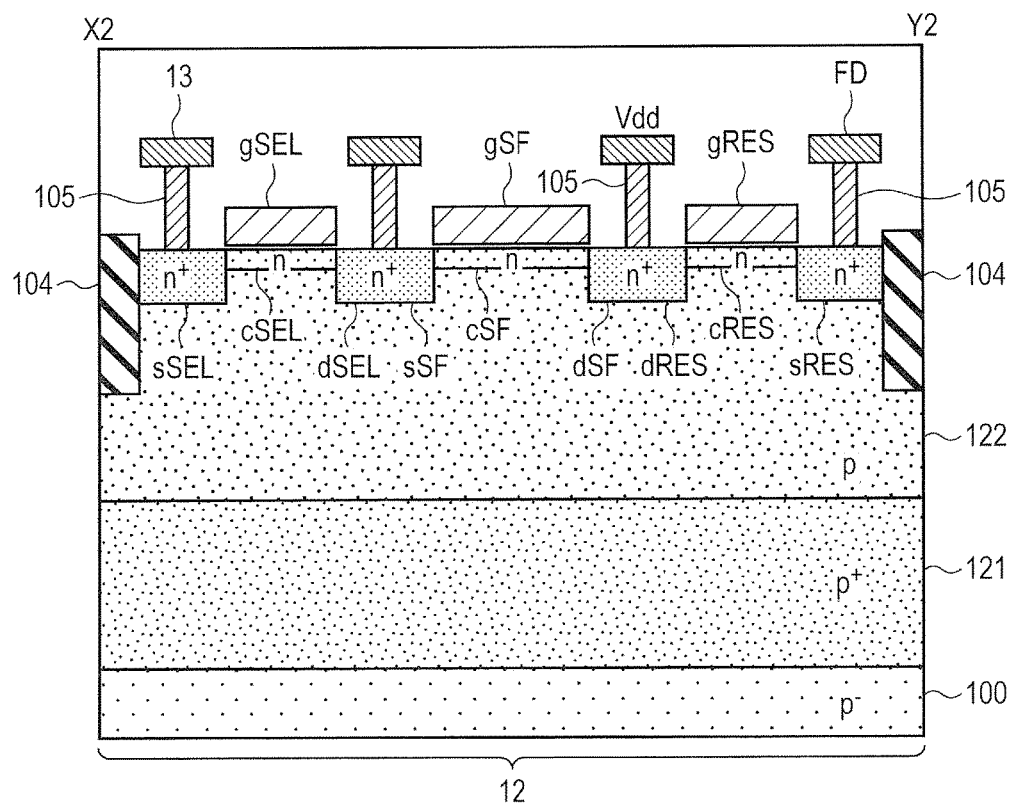
FIG. 5 is a second schematic diagram illustrating a cross section of the transfer transistor in the solid-state imaging device according to the first embodiment.

FIG. 5 is a schematic diagram illustrating a cross section of the pixel 1 in the solid-state imaging device according to the first embodiment and illustrates the cross section taken along the X2-Y2 line in the plan view illustrated in FIG. 2. The pixel isolating portion 104 to prevent an electrical interference between the pixels is formed in a boundary portion between the pixel 1 and the pixel adjacent thereto in a manner similar to FIG. 3.

A p-type second isolating region 121 serving as a barrier of the signal charges which leak to the photoelectric conversion unit PD of the adjacent pixel 1 is formed in a deep region of the second semiconductor region 12 in a manner similar to the first semiconductor region 11. The second isolating region 121 is formed by injecting boron into the well region 100 by, for example, an ion injection. p-type impurity concentration of the second isolating region 121 is higher than p-type impurity concentration of the p-type well region 100. When the second isolating region 121 is formed, a fourth isolating region 122 is formed as a side effect by the resist approximation effect.

Distribution of the p-type impurity concentration in the second isolating region 121 and the fourth isolating region 122 is similar to distribution of the p-type impurity concentration in the first isolating region 111 and the third isolating region 112.

An amplifier transistor SF, a reset transistor RES, and a select transistor SEL are formed in the upper surface of the second semiconductor region 12 of the well region 100. Each region constructing each transistor is illustrated in FIG. 5 in such a manner that a prefix such as "g" (gate electrode), "c" (buried channel region), "s" (source region), "d" (drain region), or the like is added to a denomination of each transistor. For example, the gate electrode of the amplifier transistor SF is shown by "gSF". The gate electrodes of those plurality of transistors are made of, for example, polysilicon (polycrystalline silicon). The buried channel region, source region, and drain region are formed by injecting, for example, arsenic into the upper surface of the second semiconductor region 12.

There is a case where the source region and the drain region of the transistor are shared by different transistors. For example, in FIG. 5, a source region sSF of the amplifier transistor SF and a drain region dSEL of the select transistor SEL are shared. A drain region dSF of the amplifier transistor SF and a drain region dRES of the reset transistor RES are shared.

The floating diffusion unit FD is connected to a source region sRES of the reset transistor RES through the contact 105 and is also connected to the gate electrode gSF of the amplifier transistor SF as mentioned above. The column signal line 13 is connected to a source region sSEL of the select transistor SEL through another contact 105. The electric potential Vdd is connected to the drain region dSF of the amplifier transistor SF and the drain region dRES of the reset transistor RES through another contact 105.

The amplifier transistor SF outputs a signal corresponding to the amount of signal charges held in the floating diffusion unit FD. The select transistor SEL outputs the signal output from the amplifier transistor SF to the column signal line 13. The reset transistor RES reset the signal charges held in the floating diffusion unit FD.

In the embodiment, the first isolating region 111 and the counter dope region 113 illustrated in FIG. 3 and the second isolating region 121 and the buried channel regions of the plurality of transistors illustrated in FIG. are formed by using different photomasks. Thus, the counter dope region 113 can be formed into the deeper region independently of the depth of each buried channel region of the plurality of transistors. For example, a depth position of the lower surface of the counter dope region 113 of the first semiconductor region 11 is set to be deeper than a depth position of each buried channel region of the plurality of transistors and can be set to a depth position similar to a depth position where n-type impurity concentration of the photoelectric conversion unit PD becomes a peak.

In the embodiment, the first isolating region 111 and the counter dope region 113 illustrated in FIG. 3 are formed in the first semiconductor region 11 by using the same photomask. The second isolating region 121 and the buried channel regions of the plurality of transistors illustrated in FIG. 5 are formed in the second semiconductor region 12 by using the same photomask. Thus, a manufacturing process can be simplified.

As mentioned above, according to the solid-state imaging device of the embodiment, the first semiconductor region from the upper surface of the first semiconductor region to the depth position where the impurity concentration of the first conductivity type of the photoelectric conversion unit becomes a peak has the counter dope region formed so as to surround the drain region. The depth position of the lower surface of the counter dope region is deeper than the depth position of the lower surface of each buried channel region of the plurality of transistors. Thus, the solid-state imaging device which can suppress the deterioration in characteristics of the transfer transistor caused by the impurities which extend and are distributed over the isolating region in association with the microfabrication of the pixel 1 and the manufacturing method of such a solid-state imaging device can be obtained.

Second Embodiment

Subsequently, a solid-state imaging device according to the second embodiment will be described with reference to FIGS. 6 to 8. The first embodiment has been described with respect to a construction in which one pixel 1 has one photoelectric conversion unit PD. On the other hand, the present embodiment will be described with respect to a construction in which one pixel 1 has two photoelectric conversion units. A construction different from the first embodiment will be mainly described hereinbelow.

Figure 6:
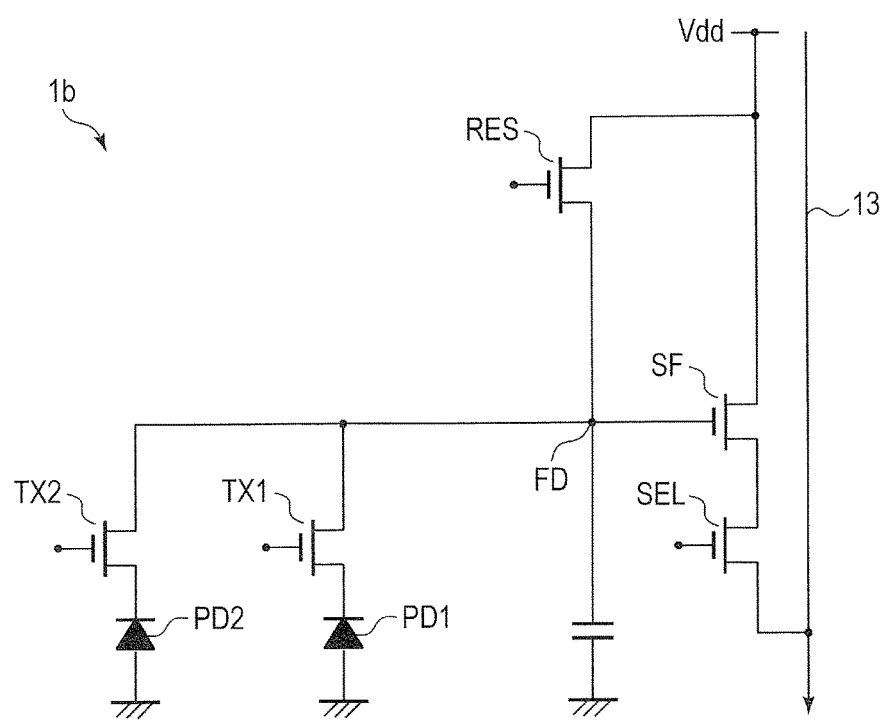
FIG. 6 is a schematic diagram illustrating an equivalent circuit of a pixel in a solid-state imaging device according to the second embodiment.

FIG. 6 is a schematic diagram illustrating an equivalent circuit of a pixel 1*b* in the solid-state imaging device according to the second embodiment. The pixel 1*b* of the present embodiment illustrated in FIG. 6 differs from the pixel 1 illustrated in FIG. 1 mainly with respect to a point that the pixel 1*b* has two photoelectric conversion units PD1 and PD2. In other words, the pixel 1*b* of the present embodiment has a construction in which the two photoelectric conversion units PD1 and PD2 share one floating diffusion unit FD.

The pixel 1*b* of the present embodiment has: a transfer transistor TX1 for transferring signal charges generated in the photoelectric conversion unit PD1 to the floating diffusion unit FD; and a transfer transistor TX2 for transferring signal charges generated in the photoelectric conversion unit PD2 to the floating diffusion unit FD. According to such a construction, in addition to the signal charges for image pickup, the signal charges for use in an application other than the image pickup can be accumulated. For example, the signal for use in an application other than the image pickup is a signal for focus detection according to a phase difference detection system, a signal for distance measurement, a signal obtained by photoelectrically converting light of a different wavelength band, or the like.

Figure 7:
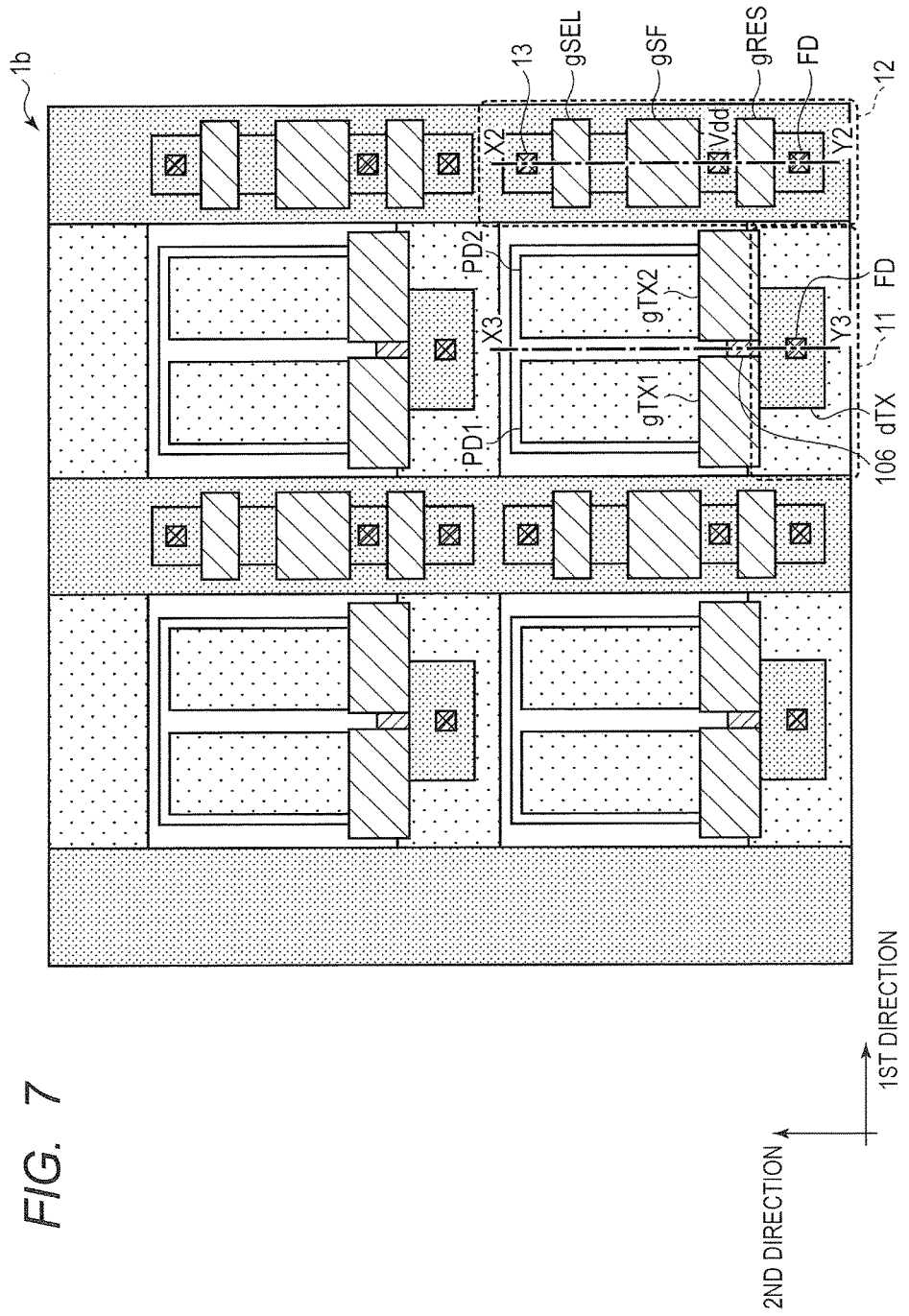
FIG. 7 is a schematic diagram illustrating a layout of a part of the pixel in the solid-state imaging device according to the second embodiment.

FIG. 7 is a schematic diagram illustrating a layout (plan view) of a part of the pixel 1*b* in the solid-state imaging device according to the second embodiment. The pixel 1*b* of the embodiment illustrated in FIG. 7 has such a construction that the photoelectric conversion unit PD illustrated in FIG. 2 is divided into the two photoelectric conversion units PD1 and PD2. The transfer transistors TX1 and TX2 are formed between the photoelectric conversion units PD1 and PD2 and the floating diffusion unit FD, respectively. Gate electrodes gTX1 and gTX2 of the transfer transistors TX1 and TX2 are illustrated in FIG. 7. The drain region dTX is shared by the transfer transistors TX1 and TX2.

Further, as illustrated in FIG. 7, according to the transfer transistors TX1 and TX2 of the embodiment, the common drain region dTX has its extending portion 106. The extending portion 106 is formed between the gate electrodes gTX1 and gTX2 when seen as a plan view. Owing to such a construction, a length of effective channel which is formed when the transfer transistors TX1 and TX2 are turned on can be shortened, and transfer characteristics of the transfer transistors TX1 and TX2 can be improved. As will be described hereinafter, since amounts of signal charges which leak from the photoelectric conversion units PD1 and PD2 to the drain region dTX through the extending portion 106 are equal, an influence of the noises by the leak charges is set off and a precision of the focus detection or the like can be improved.

Figure 8:
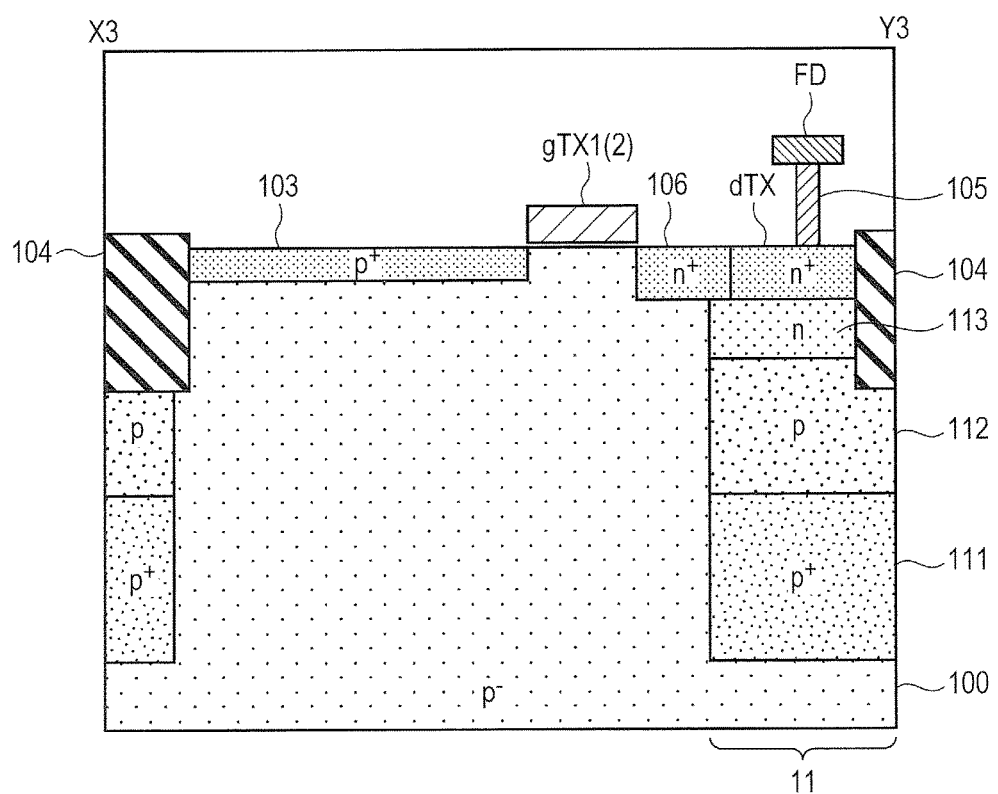
FIG. 8 is a schematic diagram illustrating a cross section of the pixel in the solid-state imaging device according to the second embodiment.

FIG. 8 is a first schematic diagram illustrating a cross section of the pixel 1b in the solid-state imaging device according to the second embodiment and illustrates the cross section taken along the X3-Y3 line in the plan view illustrated in FIG. 7.

Since the counter dope region 113 illustrated in FIGS. 7 and 8 hardly overlaps with the gate electrodes gTX1 and gTX2 when seen as a plan view and is formed to the deep position, control by the gate electrodes gTX1 and gTX2 is difficult to be exerted. Therefore, the signal charges accumulated in the photoelectric conversion units PD1 and PD2 are liable to leak into the counter dope region 113 where the potential is relatively low in the pixel 1b.

On the other hand, if the photoelectric conversion units PD1 and PD2 are formed at positions which are shifted in the first direction illustrated in FIG. 7 due to, for example, a variation upon manufacturing or the like, distances from the respective photoelectric conversion units PD1 and PD2 to the counter dope region 113 differ. Thus, the amounts of signal charges which leak from the respective photoelectric conversion units PD1 and PD2 to the counter dope region 113 also differ. Therefore, when the signal charges generated in the photoelectric conversion unit PD1 and the signal charges generated in the photoelectric conversion unit PD2 are compared, an influence by the leak charges is not set off and the precision of the focus detection or the like deteriorates.

In the present embodiment, since the common drain region dTX has the extending portion 106, the signal charges accumulated in the photoelectric conversion units PD1 and PD2 leak into the extending portion 106 of the common drain region dTX instead of the counter dope region 113. Since distances from the respective photoelectric conversion units PD1 and PD2 to the extending portion 106 are equal, amounts of signal charges which leak from the respective photoelectric conversion units PD1 and PD2 to the drain region dTX through the extending portion 106 are also equal. Thus, the influence by the leak charges is set off and the precision of the focus detection or the like can be improved.

Although the extending portion 106 and the counter dope region 113 overlap partially when seen as a plan view in FIG. 8, they need not overlap. Although the lower surface of the extending portion 106 and the upper surface of the counter dope region 113 are in contact in FIG. 8, they need not come into contact with each other. For example, by setting the depth position of the lower surface of the extending portion 106 to a position shallower than the depth position of the lower surface of the drain region dTX, the amounts of signal charges which leak from the respective photoelectric conversion units PD1 and PD2 to the extending portion 106 can be adjusted so as not to become too large.

As mentioned above, the pixel 1b of the present embodiment has the first photoelectric conversion unit (photoelectric conversion unit PD1) and the second photoelectric conversion unit (photoelectric conversion unit PD2) and has the first transfer transistor (transfer transistor TX1) and the second transfer transistor (transfer transistor TX2). The drain region dTX which is shared has the extending portion 106 between the first gate electrode of the first transfer transistor and the second gate electrode of the second transfer transistor when seen as a plan view. Thus, the precision of the focus detection or the like can be improved.

Third Embodiment

Subsequently, a solid-state imaging device according to the third embodiment will be described with reference to FIGS. 9 to 11. In the present embodiment, a plurality of photoelectric conversion units are line-symmetrically arranged to an axis of symmetry which passes through the common drain region dTX. A construction different from the second embodiment will be mainly described hereinbelow.

Figure 9:
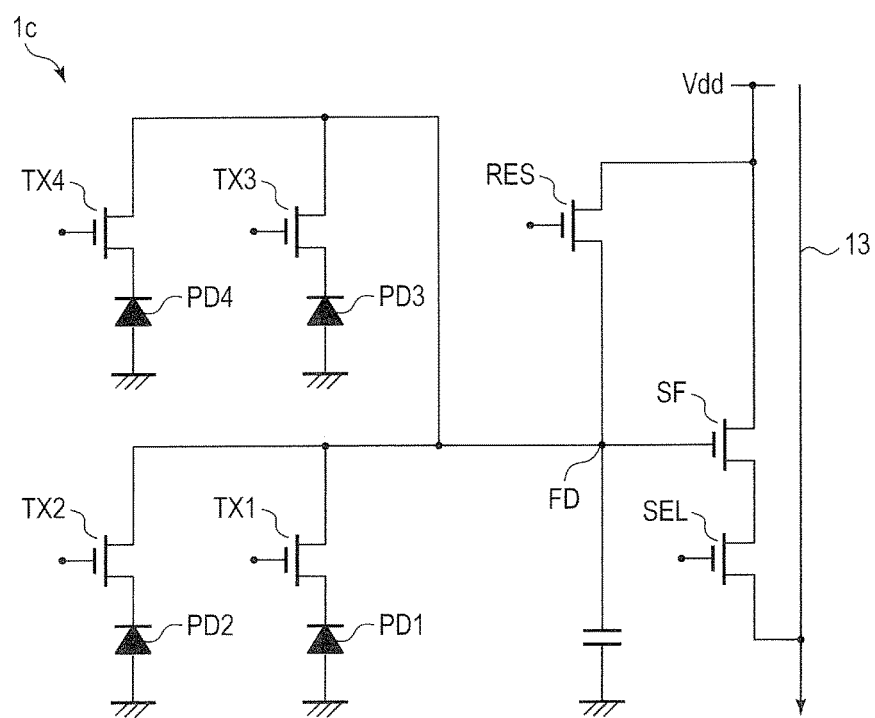
FIG. 9 is a schematic diagram illustrating an equivalent circuit of a pixel in a solid-state imaging device according to the third embodiment.

FIG. 9 is a schematic diagram illustrating an equivalent circuit of a pixel 1c in the solid-state imaging device according to the third embodiment. The pixel 1c of the present embodiment illustrated in FIG. 9 differs mainly from the pixel 1b illustrated in FIG. 6 with respect to a point that the pixel 1c has four photoelectric conversion units PD1 to PD4. In other words, the pixel 1c of the present embodiment has a construction in which the four photoelectric conversion units PD1 to PD4 share one floating diffusion unit FD. The pixel 1c of the present embodiment has transfer transistors TX1 to TX4 for respectively transferring signal charges generated in the photoelectric conversion units PD1 to PD4 to the floating diffusion unit FD.

Figure 10:
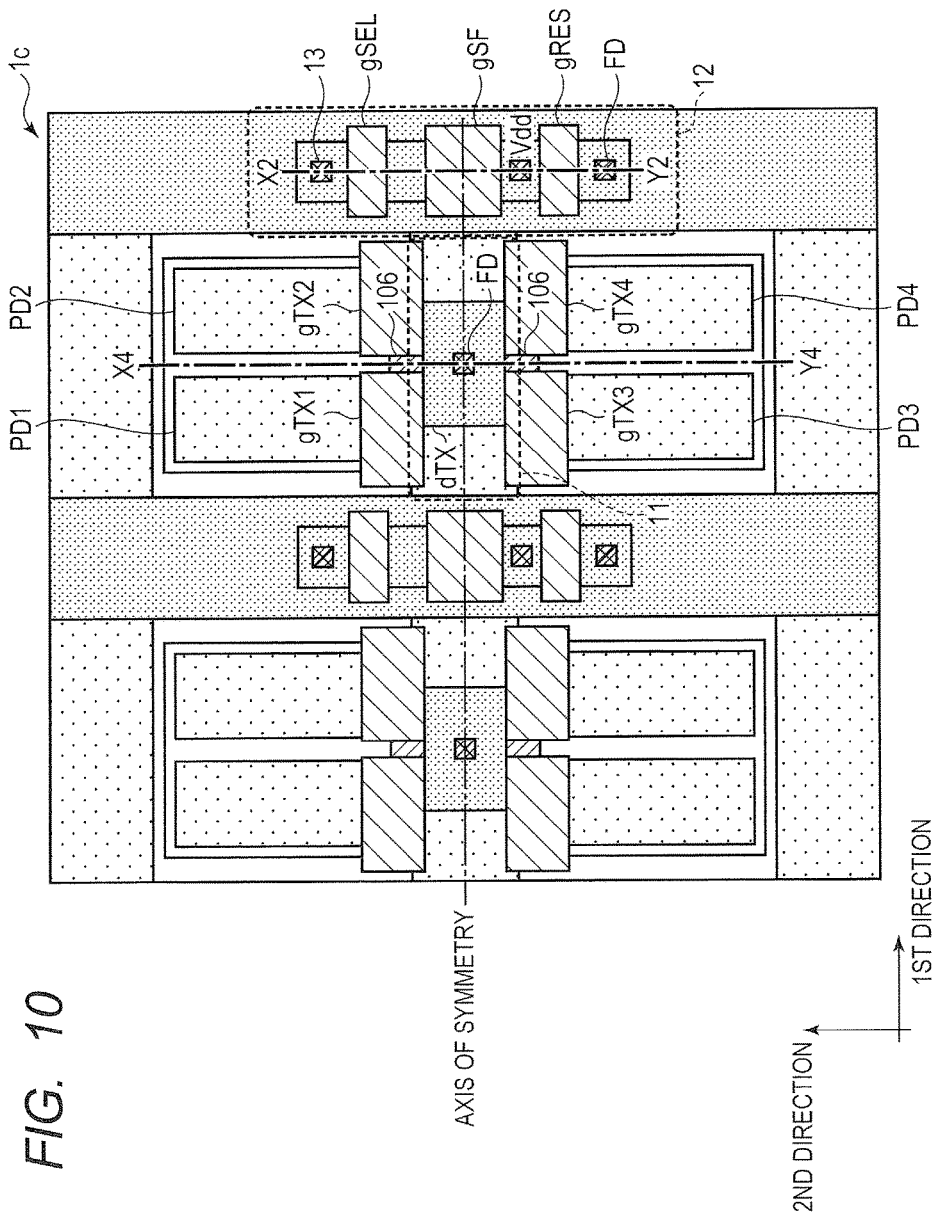
FIG. 10 is a schematic diagram illustrating a layout of a part of the pixel in the solid-state imaging device according to the third embodiment.

FIG. 10 is a schematic diagram illustrating a layout (plan view) of a part of the pixel 1c in the solid-state imaging device according to the third embodiment. In the pixel 1c of the present embodiment illustrated in FIG. 10, two pixels 1b which are neighboring in the second direction in FIG. 7 are integrated as one pixel 1c, or it is constructed in such a manner that the two pixels 1b which are neighboring in the second direction can be virtually handled as one pixel 1c.

Thus, the pixel 1c of the embodiment has the four photoelectric conversion units PD1 to PD4. The photoelectric conversion units PD1 and PD2 and the photoelectric conversion units PD3 and PD4 are line-symmetrically arranged to a line passing through the drain region dTX illustrated in FIG. 10 as an axis of symmetry. The transfer transistors TX1 to TX4 are formed between the photoelectric conversion units PD1 to PD4 and the floating diffusion unit FD, respectively. Gate electrodes gTX1 to gTX4 of the transfer transistors TX1 to TX4 are illustrated in FIG. 10. The drain region dTX is shared by the transfer transistors TX1 to TX4.

Figure 11:
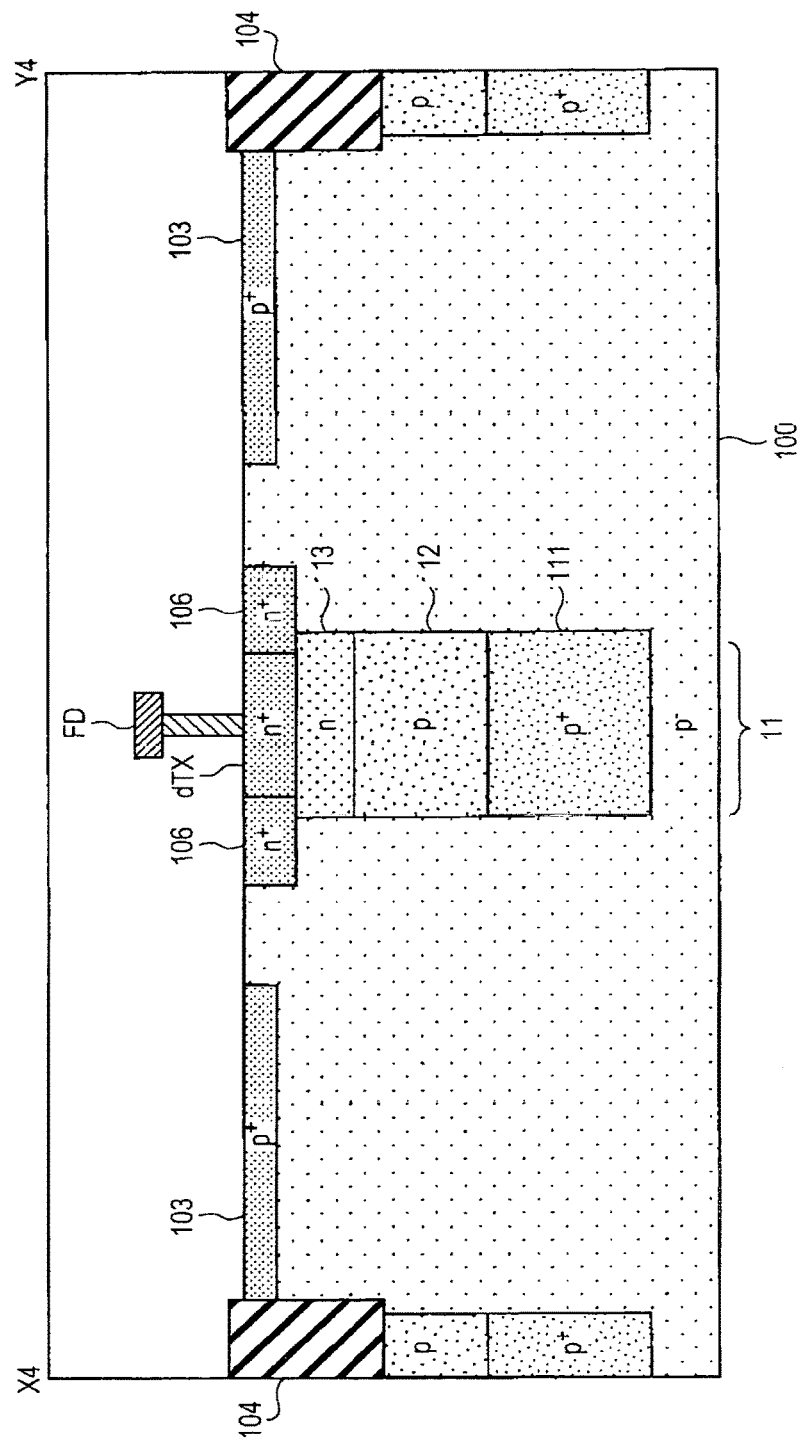
FIG. 11 is a schematic diagram illustrating a cross section of the pixel in the solid-state imaging device according to the third embodiment.

FIG. 11 is a schematic diagram illustrating a cross section of the pixel 1c in the solid-state imaging device according to the third embodiment and illustrates the cross section taken along the X4-Y4 line in the plan view illustrated in FIG. 10.

The gate electrodes gTX1 and gTX2 and the gate electrodes gTX3 and gTX4 are arranged on the opposite sides with respect to the drain region dTX.

According to such a construction, since the drain region dTX and the counter dope region 113 are arranged in a center portion of the pixel 1c, the pixel isolating portion 104 is not come into contact with the drain region dTX and the counter dope region 113. Consequently, for example, it is possible to suppress such a situation that dark electrons generated in an interface of the pixel isolating portion 104 illustrated in FIG. 8 and the drain region dTX or dark electrons generated in an interface of the pixel isolating portion 104 and the counter dope region 113 flow into the drain region dTX and the counter dope region 113. An S/N ratio of the pixel signal can be improved.

As mentioned above, the pixel 1c of the present embodiment has the first photoelectric conversion unit (photoelectric conversion unit PD1) and the third photoelectric conversion unit (photoelectric conversion unit PD3) and has the first transfer transistor (transfer transistor TX1) and the third transfer transistor (transfer transistor TX3). The first photoelectric conversion unit and the third photoelectric conversion unit are line-symmetrically arranged to a line, as an axis of symmetry, passing through the drain region dTX which is shared when seen as a plan view. Thus, the S/N ratio of the pixel signal can be improved.

Fourth Embodiment

Figure 12:
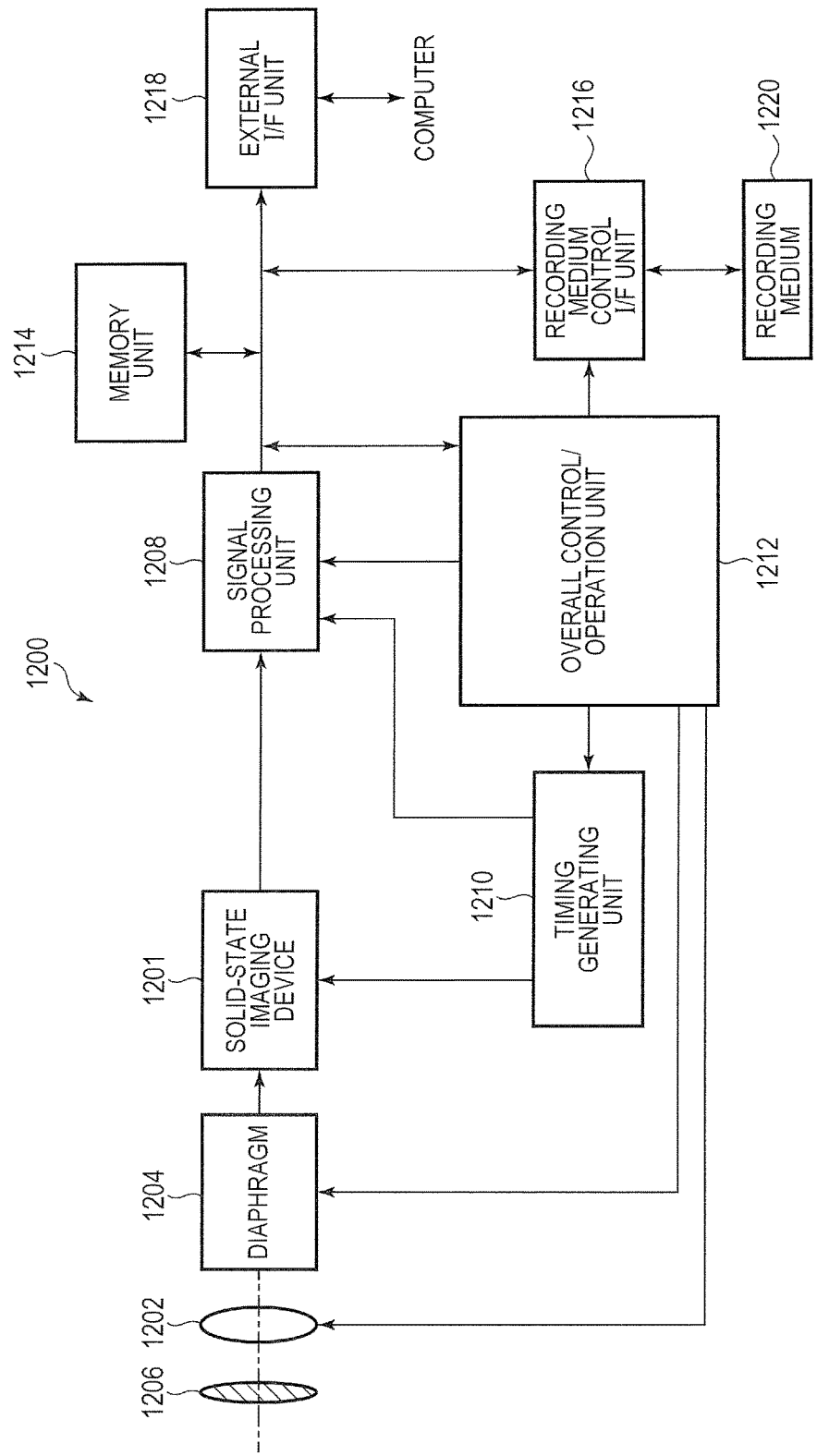
FIG. 12 is a block diagram illustrating an example of a construction of an imaging system according to the fourth embodiment.

Subsequently, an imaging system 1200 according to the fourth embodiment will be described with reference to FIG. 12. The imaging system 1200 of the embodiment has the solid-state imaging device of any one of the first to third embodiments. For example, a digital still camera, a digital camcorder, a copying apparatus, a facsimile, a cellular phone, an onboard camera, an observation satellite, or the like can be mentioned. A camera module having an optical system such as a lens and the like and a solid-state imaging device is also incorporated in the imaging system 1200. FIG. 12 illustrates a block diagram of the digital still camera as an example of the imaging system 1200. The imaging system 1200 illustrated in FIG. 12 has a lens protection barrier 1206, a lens 1202, a diaphragm 1204, a solid-state imaging device 1201, and a signal processing unit 1208. The imaging system 1200 also has a timing generating unit 1210, an overall control/operation unit 1212, a memory unit 1214, a recording medium control I/F unit 1216, a recording medium 1220, and an external I/F unit 1218.

The lens protection barrier 1206 protects the lens 1202. The lens 1202 forms an optical image of an object onto the solid-state imaging device 1201. The diaphragm 1204 varies an amount of light which has passed through the lens 1202. The solid-state imaging device 1201 is the solid-state imaging device described in the first to third embodiments and converts the optical image formed by the lens 1202 into image data. The signal processing unit 1208 executes various kinds of corrections and a data compression to the image data output from the solid-state imaging device 1201. The timing generating unit 1210 outputs various kinds of timing signals to the solid-state imaging device 1201 and the signal processing unit 1208. The overall control/operation unit 1212 controls the whole digital still camera. The memory unit 1214 temporarily stores the image data. The recording medium control I/F unit 1216 records or reads out the image data to/from the recording medium 1220. The recording medium 1220 is a detachable recording medium such as a semiconductor memory or the like for recording or reading out the image data. The external I/F unit 1218 communicates with an external computer or the like.

The timing signal may be supplied from the outside of the imaging system 1200. It is sufficient that the imaging system 1200 of the embodiment has at least the solid-state imaging device 1201 and the signal processing unit 1208 for processing the image pickup signal output from the solid-state imaging device 1201. An A/D converting unit may be provided on a semiconductor substrate of the solid-state imaging device 1201 or may be provided on another semiconductor substrate different from the semiconductor substrate of the solid-state imaging device 1201. The solid-state imaging device 1201 and the signal processing unit 1208 may be formed on the same semiconductor substrate.

Although the foregoing embodiment has been described on the assumption that the conductivity type (first conductivity type) of the majority carriers of the transistor is the n type and the conductivity type (second conductivity type) of the minority carriers is the p type, the conductivity type of the majority carriers and the conductivity type of the minority carriers may be reversed. The foregoing respective embodiments can be also combined and applied.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-143096, filed Jul. 21, 2016, which is hereby incorporated by reference herein in its entirety.

What is claimed is:

1. A solid-state imaging device comprising:
a pixel in which a photoelectric conversion unit, a transfer transistor configured to transfer electric charges from the photoelectric conversion unit to a floating diffusion, and an outputting unit configured to output a signal corresponding to an amount of electric charges transferred to the floating diffusion are arranged in a well region of a second conductivity type;

a first semiconductor region extending in a first direction and which includes:
- a first isolating region of the second conductivity type which is formed below the floating diffusion which is of a first conductivity type; and
- a first counter dope region of the first conductivity type which surrounds the floating diffusion and in which an impurity concentration of the first conductivity type of the first counter dope region is lower than an impurity concentration of the first conductivity type of the floating diffusion; and a second semiconductor region extending in a second direction which perpendicularly crosses the first direction in a plan view and which includes:
- a second counter dope region of the first conductivity type formed in channel regions of a plurality of transistors which the outputting unit has; and
- a second isolating region of the second conductivity type which is formed below the second counter dope region, wherein a depth position of a lower surface of the first counter dope region is deeper than a depth position of a lower surface of the second counter dope region.

2. The solid-state imaging device according to claim 1, wherein:
the transfer transistor further has a gate electrode formed over a channel region between the photoelectric conversion unit and the floating diffusion through an insulating film; and
the first counter dope region overlaps partially with the gate electrode in a plan view.

3. The solid-state imaging device according to claim 1, wherein:
a third isolating region in which an impurity concentration of the second conductivity type is higher as a depth becomes shallower is further formed over the first isolating region of the first semiconductor region; and
a fourth isolating region in which an impurity concentration of the second conductivity type is higher as a depth becomes shallower is further formed over the second isolating region of the second semiconductor region.

4. The solid-state imaging device according to claim 1, wherein the plurality of transistors of the outputting unit include:
an amplifier transistor configured to output a signal corresponding to the amount of electric charges transferred to the floating diffusion;
a reset transistor configured to reset the electric charges transferred to the floating diffusion; and
a select transistor configured to output the signal output from the amplifier transistor to a column signal line.

5. The solid-state imaging device according to claim 1, wherein:
the photoelectric conversion unit includes a first photoelectric conversion unit and a second photoelectric conversion unit;
the transfer transistor includes a first transfer transistor and a second transfer transistor which share the floating diffusion, the first transfer transistor transfers the electric charges from the first photoelectric conversion unit to the floating diffusion, and the second transfer transistor transfers the electric charges from the second photoelectric conversion unit to the floating diffusion;
the first transfer transistor and the second transfer transistor have a first gate electrode and a second gate electrode, formed through an insulating film, over channel regions between the photoelectric conversion unit and the floating diffusion, respectively; and
the floating diffusion has an extending portion between the first gate electrode and the second gate electrode in a plan view.

6. The solid-state imaging device according to claim 5, wherein a depth position of a lower surface of the extending portion is shallower than a depth position of a lower surface of the first counter dope region.

7. The solid-state imaging device according to claim 1, wherein:
the photoelectric conversion unit includes a first photoelectric conversion unit and a third photoelectric conversion unit;
the transfer transistor includes a first transfer transistor and a third transfer transistor which share the floating diffusion, the first transfer transistor transfers the electric charges from the first photoelectric conversion unit to the floating diffusion, and the third transfer transistor transfers the electric charges from the third photoelectric conversion unit to the floating diffusion; and
the first photoelectric conversion unit and the third photoelectric conversion unit are line-symmetrically arranged while setting a line passing through the floating diffusion to an axis of symmetry in a plan view.

8. The solid-state imaging device according to claim 7, further comprising a pixel isolating portion formed in a boundary portion between adjacent pixels, and wherein
the pixel isolating portion does not come into contact with the floating diffusion and the first counter dope region.

9. An imaging system having a solid-state imaging device and a signal processing unit configured to process a signal which is output from the solid-state imaging device, wherein:
the solid-state imaging device comprises:
a pixel in which a photoelectric conversion unit, a transfer transistor configured to transfer electric charges from the photoelectric conversion unit to a floating diffusion, and an outputting unit configured to output a signal corresponding to an amount of electric charges transferred to the floating diffusion are arranged in a well region of a second conductivity type;
a first semiconductor region extending in a first direction and which includes:
- a first isolating region of the second conductivity type which is formed below the floating diffusion of a first conductivity type; and
- a first counter dope region of the first conductivity type which surrounds the floating diffusion and in which an impurity concentration of the first conductivity type of the first counter dope region is lower than an impurity concentration of the first conductivity type of the floating diffusion; and
a second semiconductor region extending in a second direction which perpendicularly crosses the first direction in a plan view and which includes:
- a second counter dope region of the first conductivity type formed in channel regions of a plurality of transistors which the outputting unit has; and a second isolating region of the second conductivity type which is formed below the second counter dope region, wherein a depth position of a lower surface of the first counter dope region is deeper than a depth position of a lower surface of the second counter dope region.

10. The solid-state imaging device according to claim 1, wherein an impurity concentration of the first isolating region is higher than of the well region.

11. The solid-state imaging device according to claim 1, wherein an impurity concentration of the second isolating region is higher than an impurity concentration of the well region.

12. The solid-state imaging device according to claim 1, wherein the second counter dope region is a buried channel region of the plurality of transistors.

* * * * *